(12) United States Patent
Minemura (10) Patent No.: US 11,417,558 B2
(45) Date of Patent: Aug. 16, 2022

(54) CERAMICS SUBSTRATE, METHOD OF MANUFACTURING THE SAME, ELECTROSTATIC CHUCK, SUBSTRATE FIXING DEVICE, AND SEMICONDUCTOR DEVICE PACKAGE

(71) Applicant: SHINKO ELECTRIC INDUSTRIES CO., LTD., Nagano (JP)

(72) Inventor: Tomotake Minemura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/231,100

(22) Filed: Apr. 15, 2021

(65) Prior Publication Data

US 2021/0335644 A1 Oct. 28, 2021

(30) Foreign Application Priority Data

Apr. 23, 2020 (JP) .............................. JP2020-076847

(51) Int. Cl.
| | |
|---|---|
| *H01L 23/498* | (2006.01) |
| *H01L 21/683* | (2006.01) |
| *H01L 23/13* | (2006.01) |
| *H01L 23/15* | (2006.01) |
| *H01L 21/48* | (2006.01) |
| *H01L 21/67* | (2006.01) |
| *H01L 23/367* | (2006.01) |
| *H01J 37/32* | (2006.01) |

(52) U.S. Cl.
CPC ........ *H01L 21/6833* (2013.01); *H01L 21/486* (2013.01); *H01L 21/4857* (2013.01); *H01L 23/13* (2013.01); *H01L 23/15* (2013.01); *H01L 23/49822* (2013.01); *H01L 23/49866* (2013.01); *H01J 37/32715* (2013.01); *H01J 2237/2007* (2013.01); *H01L 21/67069* (2013.01); *H01L 23/367* (2013.01)

(58) Field of Classification Search
CPC .......................... H01L 23/15; H01L 23/49866
USPC ......................................................... 174/256
See application file for complete search history.

(56) References Cited

U.S. PATENT DOCUMENTS

| | | | | |
|---|---|---|---|---|
| 5,679,469 | A * | 10/1997 | Shimoda | .................. C04B 41/52 427/376.6 |
| 6,045,714 | A * | 4/2000 | Humenik | .............. H05K 3/4061 216/17 |
| 2013/0042912 | A1* | 2/2013 | Kurihara | ................ B23K 1/203 228/256 |
| 2018/0116055 | A1* | 4/2018 | Murakami | ........ H01L 23/49838 |
| 2019/0148278 | A1* | 5/2019 | Imayoshi | .......... H01L 23/49827 257/774 |

(Continued)

FOREIGN PATENT DOCUMENTS

JP 2011-228727 11/2011

*Primary Examiner* — Sherman Ng
(74) *Attorney, Agent, or Firm* — Rankin, Hill & Clark LLP (57) ABSTRACT

A ceramics substrate includes: a substrate body; an electric conductor layer that is built in the substrate body; and a via that is built in the substrate body to be electrically connected to the electric conductor layer. The substrate body is made of ceramics containing aluminum oxide. The via is made of a fired body of an electric conductor paste. The electric conductor paste contains molybdenum as a main component and further contains nickel oxide, aluminum oxide, and silicon dioxide.

15 Claims, 11 Drawing Sheets

(56) References Cited

U.S. PATENT DOCUMENTS

2019/0304877 A1\* 10/2019 Mobley .................... H01B 1/22
2020/0105658 A1\* 4/2020 Baba .................... H05K 1/0206

\* cited by examiner

CERAMICS SUBSTRATE, METHOD OF MANUFACTURING THE SAME, ELECTROSTATIC CHUCK, SUBSTRATE FIXING DEVICE, AND SEMICONDUCTOR DEVICE PACKAGE

This application claims priority from Japanese Patent Applications No. 2020-076847, filed on Apr. 23, 2020, the entire contents of which are herein incorporated by reference.

BACKGROUND

Technical Field

The present disclosure relates to a ceramics substrate, a method of manufacturing the same, an electrostatic chuck, a substrate fixing device, and a semiconductor device package.

Background Art

In the background art, a film forming apparatus or a plasma etching apparatus used in manufacturing a semiconductor device has a stage for accurately retaining a wafer in a vacuum processing chamber. For example, a substrate fixing device that adsorbs and retains a wafer by an electrostatic chuck mounted on a base plate has been proposed as such a stage.

The electrostatic chuck includes a substrate body, an electrostatic electrode built in the substrate body, and a ceramics substrate having vias etc. electrically connected to the electrostatic electrode. The electrostatic electrode or the vias are produced as follows. That is, for example, an electrically conductive paste containing metal powder high in melting point such as tungsten (W), molybdenum (Mo) or a molybdenum-manganese (Mo—Mn) alloy, a resin binder, etc. is formed on a ceramics green sheet by a screen printing method or the like, and fired (e.g. see JP-A-2011-228727).

However, in general, a sintering aid (such as silica, magnesia, calcia or yttria) is often contained in alumina ceramics. The value of insulation resistance of the ceramics containing the sintering aid thus tends to decrease as temperature of the usage environment rises. To solve this problem, sintering aid-free alumina ceramics small in temperature dependence of insulation resistance are desired. However, since there is no sintering aid that can turn to a liquid phase during sintering, there is a case that bonding strength between the ceramics forming the substrate body and the vias cannot be secured in the ceramics substrate of the electrostatic chuck etc.

SUMMARY

The present disclosure provides a ceramics substrate in which bonding strength between ceramics forming a substrate body and vias is improved.

A certain embodiment provides a ceramics substrate including: a substrate body; an electric conductor layer that is built in the substrate body; and a via that is built in the substrate body to be electrically connected to the electric conductor layer. The substrate body is made of ceramics containing aluminum oxide. The via is made of a fired body of an electric conductor paste. The electric conductor paste contains molybdenum as a main component and further contains nickel oxide, aluminum oxide, and silicon dioxide.

DESCRIPTION OF EMBODIMENTS

Embodiments of the present disclosure will be described below with reference to the drawings. In each drawing, the same constituent portions will be designated by the same reference signs correspondingly and respectively, and duplicate description thereof may be omitted.

First Embodiment

[Structure of Substrate Fixing Device]

Figure 1:
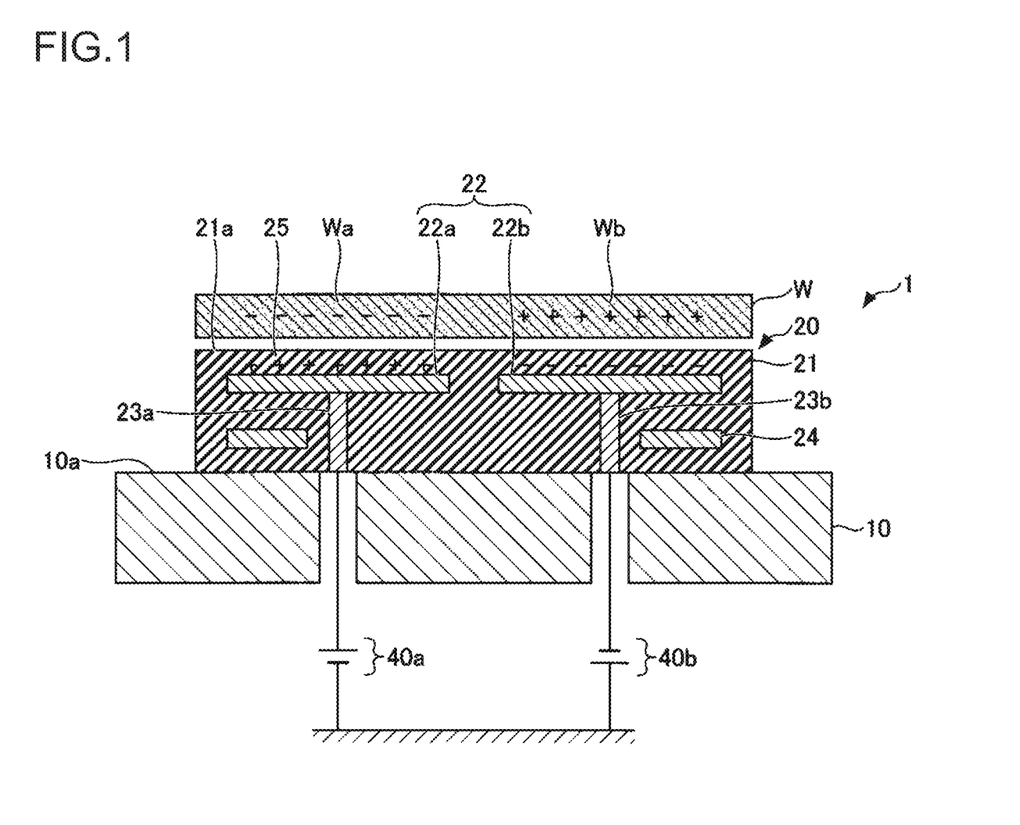
FIG. 1 is a sectional view illustrating a substrate fixing device according to a first embodiment in a simplified manner.

FIG. 1 is a sectional view illustrating a substrate fixing device according to a first embodiment in a simplified manner. As shown in FIG. 1, the substrate fixing device 1 includes a base plate 10 and an electrostatic chuck 20 as main constituent elements. The substrate fixing device 1 is a device that uses the electrostatic chuck 20 to adsorb and retain a substrate W (such as a semiconductor wafer) which is an object to be adsorbed.

The base plate 10 is a member for mounting the electrostatic chuck 20 thereon. The base plate 10 is, for example, about 20 mm to 40 mm thick. The base plate 10 is, for example, formed out of a metal material such as aluminum or cemented carbide, a composite material of the metal material and a ceramics material, or the like, and can be used as an electrode etc. for controlling plasma. For example, aluminum or an aluminum alloy whose surface has been subjected to alumite treatment (formation of an insulation layer) can be suitably used as the base plate 10 from viewpoints of easy availability, easy machinability, excellent thermal conductivity, etc.

For example, energy for making generated ions etc. in a plasma state collide with the substrate W adsorbed on the electrostatic chuck 20 can be controlled by predetermined high-frequency power supplied to the base plate 10. Thus, etching processing can be performed on the substrate W effectively.

A gas supply path for introducing inert gas that cools the substrate W adsorbed on the electrostatic chuck 20 may be provided inside the base plate 10. When the inert gas such as He or Ar is introduced into the gas supply path from the outside of the substrate fixing device 1 and the inert gas is supplied to a back face of the substrate W adsorbed on the electrostatic chuck 20, the substrate W can be cooled.

A refrigerant flow path may be provided inside the base plate 10. For example, the refrigerant flow path is a hole formed annularly inside the base plate 10. For example, a refrigerant such as cooling water or Galden is introduced into the refrigerant flow path from the outside of the substrate fixing device 1. When the refrigerant is circulated in the refrigerant flow path to cool the base plate 10, the substrate W adsorbed on the electrostatic chuck 20 can be cooled.

The electrostatic chuck 20 is a portion that adsorbs and retains the substrate W that is the object to be adsorbed. The planar shape of the electrostatic chuck 20 is formed in accordance with the shape of the substrate W. For example, the planar shape of the electrostatic chuck 20 is circular. The diameter of the wafer, which is the object to be adsorbed by the electrostatic chuck 20 is, for example, 8, 12, or 18 inches.

A plan view means a view of an object from a normal direction of an upper face 10a of the base plate 10, and a planar shape refers to the shape of the object viewed from the normal direction of the upper face 10a of the base plate 10.

The electrostatic chuck 20 is provided on the upper face 10a of the base plate 10 through an adhesive layer. The adhesive layer is, for example, a silicone-based adhesive agent. The adhesive layer is, for example, about 0.1 mm to 2.0 mm thick. The adhesive layer has an effect of adhesively bonding the base plate 10 and the electrostatic chuck 20 to each other and reducing stress caused by a difference in coefficient of thermal expansion between the electrostatic chuck 20 made of ceramics and the base plate 10 made of aluminum. The electrostatic chuck 20 may be fixed to the base plate 10 with screws.

The electrostatic chuck 20 is a ceramics substrate having a substrate body 21, an electrostatic electrode 22 (an example of an electric conductor layer), vias 23a and 23b, and a heating element 24 as main constituent elements. An upper face of the substrate body 21 is a mount face 21a on which the object to be adsorbed can be mounted. The electrostatic chuck 20 is, for example, a Johnsen-Rahbek type electrostatic chuck. However, the electrostatic chuck 20 may be a Coulomb force type electrostatic chuck.

The substrate body 21 is a dielectric. Specifically, the substrate body 21 is made of ceramics containing aluminum oxide ($Al_2O_3$). The substrate body 21 is, for example, about 5 mm to 10 mm thick. Moreover, a relative dielectric constant of the substrate body 21 is, for example, about 9 to 10 at an AC voltage frequency of 1 kHz.

Purity of the aluminum oxide in the substrate body 21 is preferably 99.5% or more. The purity of 99.5% or more expresses that the substrate body 21 is formed without adding any sintering aid. Further, the purity of 99.5% or more means that unintended impurities may be contained in a manufacturing process or the like. The substrate body 21 preferably has a relative density of 97% or more with respect to the aluminum oxide. An average particle size of the aluminum oxide in the substrate body 21 is preferably 1.0 µm or more and 3.0 µm or less.

The electrostatic electrode 22 is, for example, a thin film electrode formed by an electric conductor pattern. The electrostatic electrode 22 is built in the substrate body 21. In the present embodiment, the electrostatic electrode 22 is a bipolar type and has a first electrostatic electrode 22a and a second electrostatic electrode 22b. Alternatively, a unipolar type consisting of one electrostatic electrode may be used as the electrostatic electrode 22.

The first electrostatic electrode 22a is electrically connected to the via 23a to be connected to a positive electrode side of a power source 40a through the via 23a. The power source 40a is provided outside the substrate fixing device 1. Further, the second electrostatic electrode 22b is electrically connected to the via 23b to be connected to a negative electrode side of a power source 40b through the via 23b. The power source 40b is provided outside the substrate fixing device 1. A negative electrode side of the power source 40a and a positive electrode side of the power source 40b are connected outside the substrate fixing device 1, and their contact points have a ground potential.

Each of the vias 23a and 23b is made of a fired body, which contains molybdenum as a main component and further includes nickel oxide, aluminum oxide, and silicon dioxide. Due to the molybdenum, the nickel oxide, the aluminum oxide, and the silicon dioxide contained in the via 23a, 23b, bonding strength between the ceramics forming the substrate body 21 and the via 23a, 23b can be improved even when the substrate body 21 is made of ceramics that contains aluminum oxide ($Al_2O_3$) and that has been formed without adding any sintering aid.

Further, an electrically conductive paste containing tungsten (W) as a main component and further includes nickel oxide (NiO), aluminum oxide, and silicon dioxide ($SiO_2$) is preferably used as the material of the electrostatic electrode 22. In this case, adhesion between the electrostatic electrode 22 and the vias 23a and 23b can be improved even if the vias 23a and 23b contain the molybdenum, the nickel oxide, the aluminum oxide, and the silicon dioxide.

Each of the vias 23a and 23b is preferably made of the fired body of an electrically conductive paste in which an amount of the nickel oxide added is 0.2 wt % to 1.0 wt % with respect to the molybdenum. Moreover, it is preferable that the via 23a, 23b is the fired body of the electrically conductive paste in which an amount of the aluminum oxide added and an amount of the silicon dioxide added are 2.0 wt % to 20.0 wt % and 0.2 wt % to 3.0 wt % respectively with respect to the molybdenum. Moreover, it is preferable that an average particle size of the molybdenum contained in the via 23a, 23b is 0.5 µm to 3.0 µm, an average particle size of the nickel oxide contained in the via 23a, 23b is 5.0 µm to 15.0 µm, an average particle size of the aluminum oxide contained in the via 23a, 23b is 0.1 µm to 4.0 µm, and an average particle size of the silicon dioxide contained in the via 23a, 23b is 0.1 µm to 12.0 µm. Each of the average particle sizes can be measured, for example, by use of a laser light diffraction/scattering device.

Incidentally, a pad may be provided on one end of the via 23a that is positioned on an opposite side to the other end of the via 23a facing the first electrostatic electrode 22a. Another pad may be provided on one end of the via 23b positioned on an opposite side to the other end of the via 23b facing the second electrostatic electrode 22b. The pad provided on the one end of the via 23a may be connected to the power source 40a, and the pad provided on the one end of the via 23b may be connected to the power source 40b.

A positive (+) voltage is applied to the first electrostatic electrode 22a from the power supply 40a through the via 23a, and a negative (−) voltage is applied to the second electrostatic electrode 22b from the power supply 40b through the via 23b. As a result, the first electrostatic electrode 22a is charged with positive (+) charges, and the second electrostatic electrode 22b is charged with negative (−) charges. In accordance with this, negative (−) charges are induced in a portion Wa of the substrate W facing the first electrostatic electrode 22a, and positive (+) charges are induced in a portion Wb of the substrate W facing the second electrostatic electrode 22b.

When the substrate W, the electrostatic electrode 22, and a ceramics portion 25 of the electrostatic chuck 20 (the substrate body 21) disposed between the substrate W and the electrostatic electrode 22 are regarded as a capacitor, the ceramics portion 25 corresponds to a dielectric layer. The substrate W is electrostatically adsorbed on the electrostatic chuck 20 by Coulomb force generated between the electrostatic electrode 22 and the substrate W through the ceramics portion 25. Retentive Adsorption force is stronger as the voltage applied to the electrostatic electrode 22 is higher.

The heating element 24 is built in the substrate body 21. The heating element 24 is a heater that is supplied with a current to heat the substrate body 21 so that the mount face 21a of the substrate body 21 can reach a predetermined temperature. The heating element 24 is disposed on a lower side (base plate 10 side) of the first electrostatic electrode 22a and the second electrostatic electrode 22b. The heating element 24 is an electric conductor which is formed into a film shape. The heating element 24 functions as heater electrodes that can perform heating control on regions (heater zones) of the substrate body 21 independently.

The heating element 24 may be provided as one heater electrode. For example, an electrically conductive paste containing tungsten as a main component and added with nickel oxide, aluminum oxide, and silicon dioxide can be used as the material of the heating element 24.

When a current is supplied to the heating element 24 from a power source provided outside the substrate fixing device 1, the heating element 24 generates heat to heat the electrostatic chuck 20. The substrate W is controlled at a predetermined temperature by the temperature of the electrostatic chuck 20. The heating temperature of the electrostatic chuck 20 is set in a range of 50° C. to 200° C. For example, the heating temperature of the electrostatic chuck 20 is, for example, set at 150° C.

Figure 2:
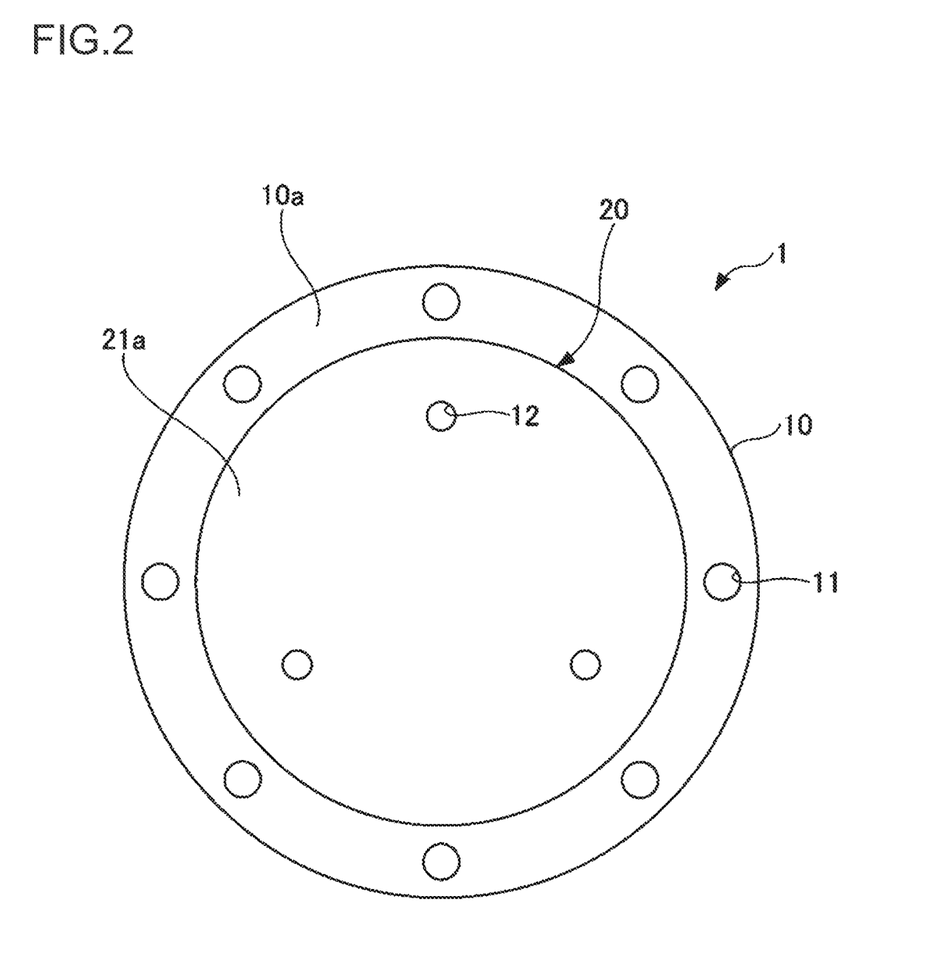
FIG. 2 is a plan view illustrating the substrate fixing device according to the first embodiment in the simplified manner.

FIG. 2 is a plan view for illustrating the substrate fixing device according to the first embodiment in a simplified manner. As shown in FIG. 2, in the substrate fixing device 1, the electrostatic chuck 20 is disposed on the base plate 10 shaped like a disk, and a peripheral edge portion of the base plate 10 is exposed around the electrostatic chuck 20. Attachment holes 11 for attaching the substrate fixing device 1 to a chamber of a semiconductor manufacturing apparatus are formed in the peripheral edge portion of the base plate 10 to be arranged along the peripheral edge portion.

Further, each of the electrostatic chuck 20 and the base plate 10 has a plurality of (three in FIG. 2) lift pin opening portions 12 in its central portion. Lift pins that move the substrate W in an up/down direction are inserted through the lift pin opening portions 12 respectively. When the substrate W is moved up from the mount face 21a by the lift pins, the substrate W can be automatically carried by a carrier device.

[Method for Manufacturing Electrostatic Chuck]

Next, a method for manufacturing the electrostatic chuck 20 will be described. FIG. 3A to FIG. 4C are perspective views illustrating a process of manufacturing the electrostatic chuck according to the first embodiment.

Figure 3A:
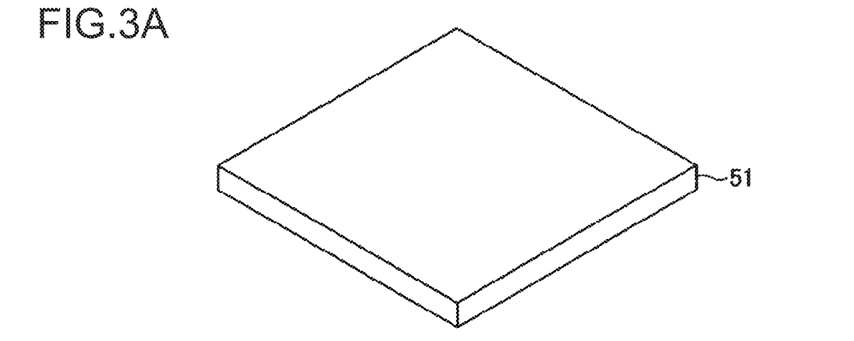
FIGS. 3A to 3D are perspective views (Part 1) illustrating a process of manufacturing an electrostatic chuck according to the first embodiment.

First, as shown in FIG. 3A, a green sheet 51 made of a ceramics material and an organic material is prepared. The green sheet 51 is, for example, formed into the shape of a rectangular plate. The ceramics material of the green sheet 51 contains aluminum oxide but does not contain any sintering aid. The organic component is removed from the green sheet 51, and the ceramics material is sintered and densified. Thus, the green sheet 51 serves as a portion of the substrate body 21 on which the substrate W shown in FIG. 1 should be mounted.

Figure 3B:
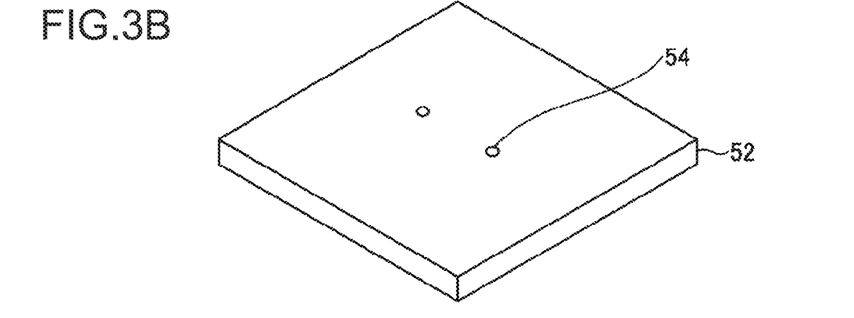

Next, as shown in FIG. 3B, a green sheet 52 made of the same material and having the same shape as those of the green sheet 51 is prepared, and via conductors 54 penetrating the green sheet 52 are formed in the green sheet 52. The green sheet 52 is fired to serve as a portion of the substrate 21 between the electrostatic electrode 22 and the heating element 24 in order to form the electrostatic electrode 22 and the vias 23a and 23b shown in FIG. 1.

Further, the via conductors 54 are fired in a step which will be described later so as to form portions of the vias 23a and 23b shown in FIG. 1. The via conductors 54 are formed as follows. That is, through holes are formed at predetermined positions in the green sheet 52. The through holes are filled with an electrically conductive paste, for example, by a printing method (screen printing).

The electrically conductive paste used for forming the via conductors 54 is made of a mixture of molybdenum as a main component, nickel oxide, aluminum oxide, silicon dioxide, and an organic material. An amount of the nickel oxide added is preferably 0.2 wt % or more and 1.0 wt/o or less with respect to the molybdenum. In order to improve sinterability of the molybdenum, 0.2 wt % or more of the nickel oxide is preferably added. On the other hand, if 5 wt % or more of the nickel oxide is added, crystals of the molybdenum become too large to obtain sufficient adhesion between the vias and the substrate 21. For firing the electrically conductive paste and the green sheet simultaneously, an average particle size of the molybdenum is preferably 0.5 μm or more and 3.0 μm or less. Similarly, an average particle size of the nickel oxide is preferably 5.0 μm or more and 15.0 μm or less.

An amount of the aluminum oxide added is preferably 2.0 wt % or more and 20.0 wt % or less with respect to the molybdenum. Further, from viewpoints of a shrinkage rate and resistivity of the vias caused by the firing, the amount of the aluminum oxide added is more preferably 7.0 wt % or more and 15.0 wt % or less. For firing the electrically conductive paste and the green sheet simultaneously, an average particle size of the aluminum oxide is preferably 0.1 μm or more and 4.0 μm or less.

An amount of the silicon dioxide added is preferably 0.2 wt % or more and 3.0 wt % or less with respect to the molybdenum. The silicon dioxide turns to a liquid phase during the firing. Therefore, in order to improve the sinterability of the molybdenum and the adhesion between the vias and the substrate body 21, 0.2 wt % or more of the silicon dioxide is preferably added. On the other hand, if more than 3.0 wt % of the silicon dioxide is added, the sinterability and the adhesion decrease. Moreover, the resistivity increases. For firing the electrically conductive paste and the green sheet simultaneously, an average particle size of the silicon dioxide is preferably 0.1 μm or more and 12.0 μm or less.

Figure 3C:
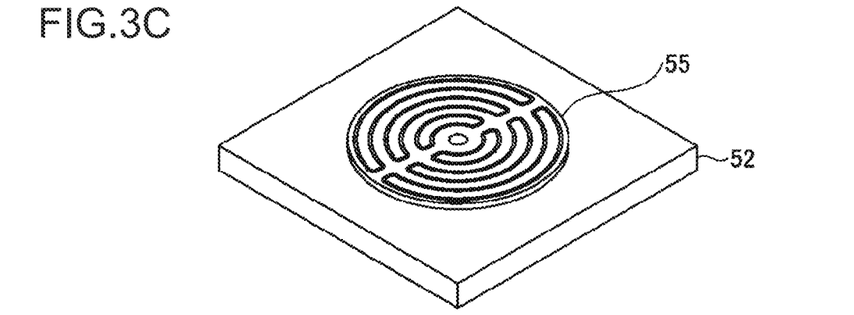

Next, as shown in FIG. 3C, an electrically conductive paste is printed on an upper face of the green sheet 52, for example, by a printing method (screen printing) to form an electric conductor pattern 55. The electric conductor pattern 55 is fired in a step that will be described later, so as to serve as the electrostatic electrode 22 shown in FIG. 1.

The electrically conductive paste used for forming the electric conductor pattern 55 is, for example, made of a mixture of tungsten as a main component, nickel oxide, aluminum oxide, silicon dioxide, and an organic material. An amount of the nickel oxide added is preferably 0.2 wt % or more and 1.0 wt % or less with respect to the tungsten. In order to improve sinterability of the tungsten, 0.2 wt % or more of the nickel oxide is preferably added. On the other hand, if 5 wt % or more of the nickel oxide is added, crystals of the tungsten become too large to obtain sufficient adhesion between the electrostatic electrode 22 and the substrate body 21. For firing the conductive paste and the green sheet simultaneously, an average particle size of the tungsten is preferably 0.5 μm or more and 3.0 μm or less. Similarly, an average particle size of the nickel oxide is preferably 5.0 μm or more and 15.0 μm or less.

An amount of the aluminum oxide added is preferably 0.2 wt % or more and 3.0 wt % or less with respect to the tungsten. In order to improve the adhesion between the electrostatic electrode 22 and the substrate body 21 that is made of the ceramics containing the aluminum oxide, 0.2 wt % or more of the aluminum oxide is preferably added. On the other hand, if more than 3.0 wt/o of the aluminum oxide is added, the sinterability decreases. Moreover, resistivity increases. For firing the electrically conductive paste and the green sheet simultaneously, an average particle size of the aluminum oxide is preferably 1.0 μm or more and 4.0 μm or less.

An amount of the silicon dioxide added is preferably 0.2 wt % or more and 3.0 wt % or less with respect to the tungsten. The silicon dioxide turns to a liquid phase during the firing. Therefore, in order to improve the sinterability of the tungsten and the adhesion between the electrostatic electrode and the substrate body 21, 0.2 wt % or more of the silicon dioxide is preferably added. On the other hand, if more than 3.0 wt % of the silicon dioxide is added, the sinterability and the adhesion decrease. Moreover, resistivity increases. For firing the electrically conductive paste and the green sheet simultaneously, an average particle size of the silicon dioxide is preferably 1.0 μm or more and 12.0 μm or less.

Figure 3D:
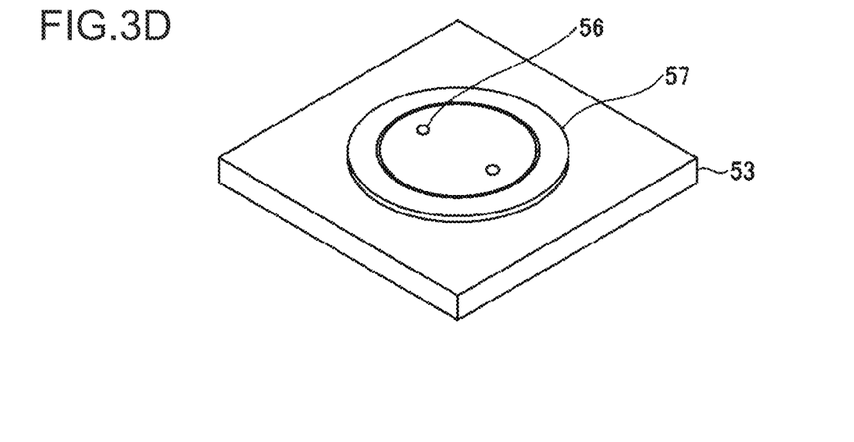

Next, as shown in FIG. 3D, a green sheet 53 made of the same material and having the same shape as those of the green sheet 51 is prepared, and via conductors 56 penetrating the green sheet 53 are formed in the green sheet 53. The green sheet 53 is fired to serve as a portion of the substrate body 21 adhesively bonded to the base plate 10, in order to form the heating element 24 shown in FIG. 1.

Further, the via conductors 56 are fired in a step that will be described later, so as to form the remaining portions of the vias 23a and 23b shown in FIG. 1. The via conductors 56 can be formed, for example, by the same method as the via conductors 54. The via conductors 54 and the via conductors 56 are formed at positions where they can be electrically connected to each other when the green sheet 52 and the green sheet 53 are laminated on each other.

Next, an electrically conductive paste is printed on an upper face of the green sheet 53, for example, by a printing method (screen printing) to form an electric conductor pattern 57. An electrically conductive paste made of the same material as the electrically conductive paste forming the aforementioned electric conductor pattern 55 can be used as the electrically conductive paste forming the conductor pattern 57. The electric conductor pattern 57 is fired in a step which will be described later, so as to serve as the heating element 24. The electric conductor pattern 57 may be formed on a lower face of the aforementioned green sheet 52.

Figure 4A:
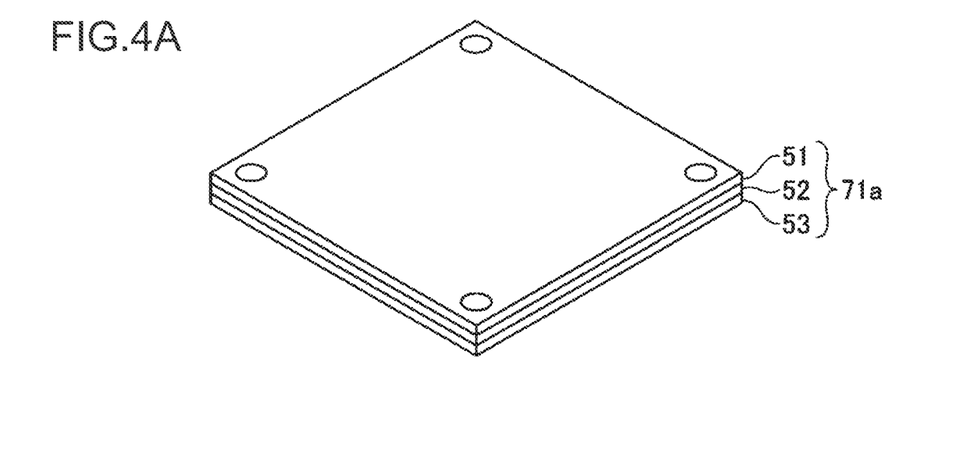
FIGS. 4A to 4C are perspective views (Part 2) illustrating the process of manufacturing the electrostatic chuck according to the first embodiment.

Next, as shown in FIG. 4A, the green sheets 51 to 53 are laminated so that a structure body 71a is formed. The green sheets 51 to 53 are pressed while being heated so as to be bonded to one another. Next, as shown in FIG. 4B, the periphery of the structure body 71a is cut off so that a disk-like structure body 71b is formed.

Figure 4B:
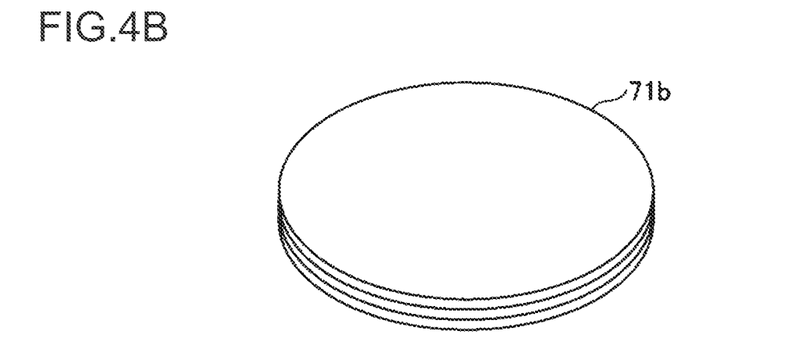
Figure 4C:
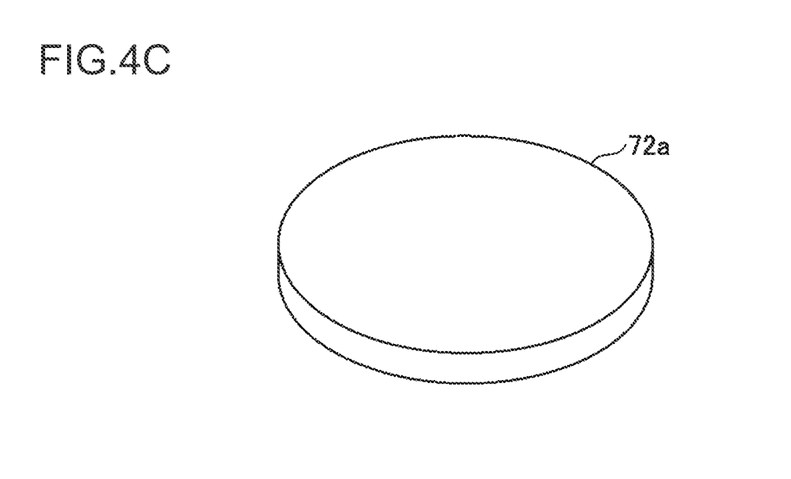

Next, the structure body 71b shown in FIG. 4B is fired so that a ceramics substrate 72a shown in FIG. 4C is obtained. Temperature for firing the structure body 71b is, for example, 1,600° C. For example, assume that the via conductors 54 and 56, which will serve as the vias 23a and 23b, are made of only molybdenum. In this case, sufficient adhesion between the vias and the ceramics cannot be obtained unless the via conductors 54 and 56 are fired under pressure. On the other hand, when the via conductors 54 and 56, which will serve as the vias 23a and 23b, contain molybdenum as a main component and is added with nickel oxide, aluminum oxide, and silicon dioxide, sufficient adhesion between the vias and the ceramics can be sufficiently obtained even if the via conductors 54 and 56 are fired under atmospheric pressure. By firing the via conductors 54 and 56 under atmospheric pressure, running cost can be reduced as compare with the case where the via conductors 54 and 56 are fired under pressure.

In this process, the electric conductor pattern 55 is sintered so that the electrostatic electrode 22 is obtained, the via conductors 54 and 56 are sintered so that the vias 23a and 23b are obtained, and the electric conductor pattern 57 is sintered so that the heating element 24 is obtained. The electrostatic electrode 22 and the vias 23a and 23b are electrically connected to each other. That is, the electrostatic electrode 22, the vias 23a and 23b, and the heating element 24 are built in the ceramics substrate 72a shown in FIG. 4C.

Next, various machinings are applied to the ceramics substrate 72a so that the electrostatic chuck 20 is completed. For example, both upper and lower faces of the ceramics substrate 72a are polished so that a mount face and a bond face are formed. Further, the lift pin opening portions 12 shown in FIG. 2 are formed in the ceramics substrate 72a.

The substrate fixing device and the like will be described below more specifically with reference to Examples and Comparative Examples. However, the present disclosure is not limited to these Examples.

Example 1, Comparative Example 1

Figure 5A:
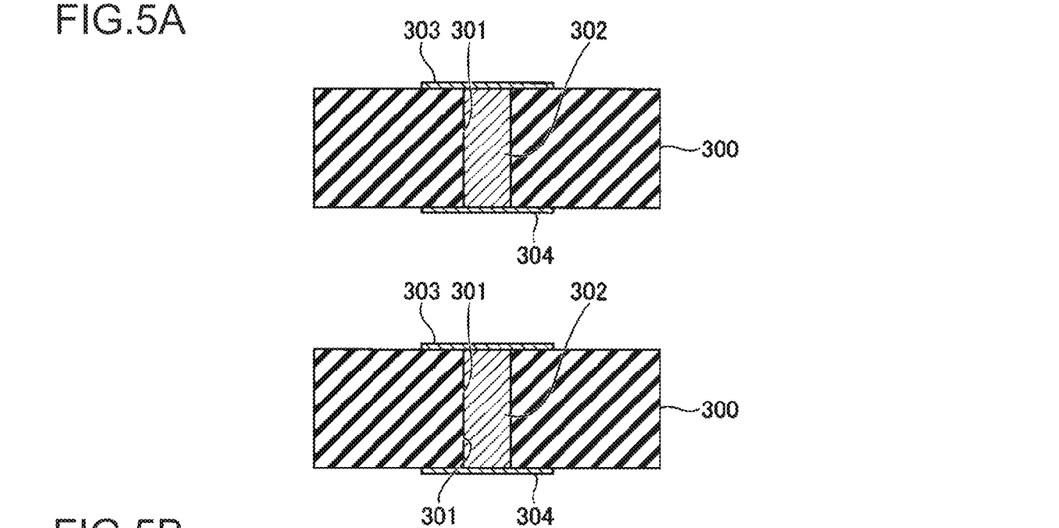
FIGS. 5A to 5C are sectional views for explaining Examples.

First, as shown in FIG. 5A, two green sheets 300 in each of which a ceramics material was made of aluminum oxide but did not contain any sintering aid were prepared. Then, through holes 301 were formed at predetermined positions in the green sheets 300, and an electrically conductive paste in which 11.0 wt % of alumina powder was added with respect to an amount of molybdenum powder was filled in the through holes 301 by a printing method (screen printing) to thereby form vias 302. Next, an electrically conductive paste was applied to opposite faces of each of the green sheets 300 by a printing method (screen printing) to thereby form pads 303 and 304 electrically connected to the vias 302.

Figure 5B:
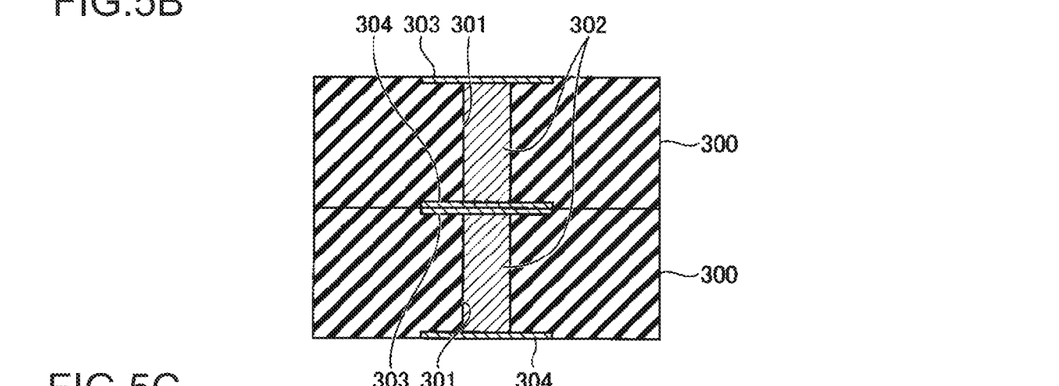
Figure 5C:
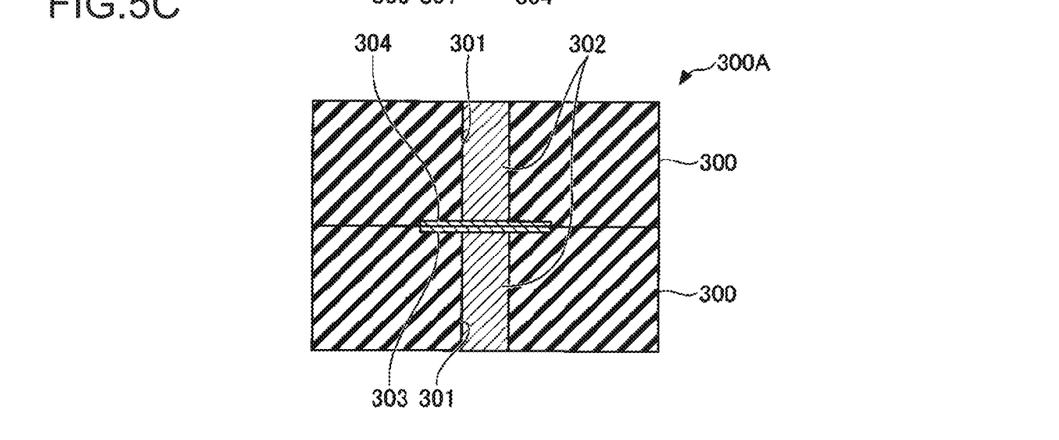

Next, as shown in FIG. 5B, the green sheets 300 were laminated so as to make the pads conductive with each other, and the green sheets 300, the vias 302, and the pads 303 and 304 were fired simultaneously under atmospheric pressure. Next, as shown in FIG. 5C, the pads formed on an upper face and a lower face of the laminate of the green sheets 300 were polished to be removed. Thus, a sample 300A according to Comparative Example 1 was produced.

Next, a sample 300B according to Example 1 was produced by the same method as the method shown in FIG. 5A to FIG. 5C except that an electrically conductive paste in which 0.5 wt % of nickel oxide powder, 11.0 wt % of alumina powder, and 2.0 wt % of silica powder were added with respect to an amount of molybdenum powder.

Figure 6A:
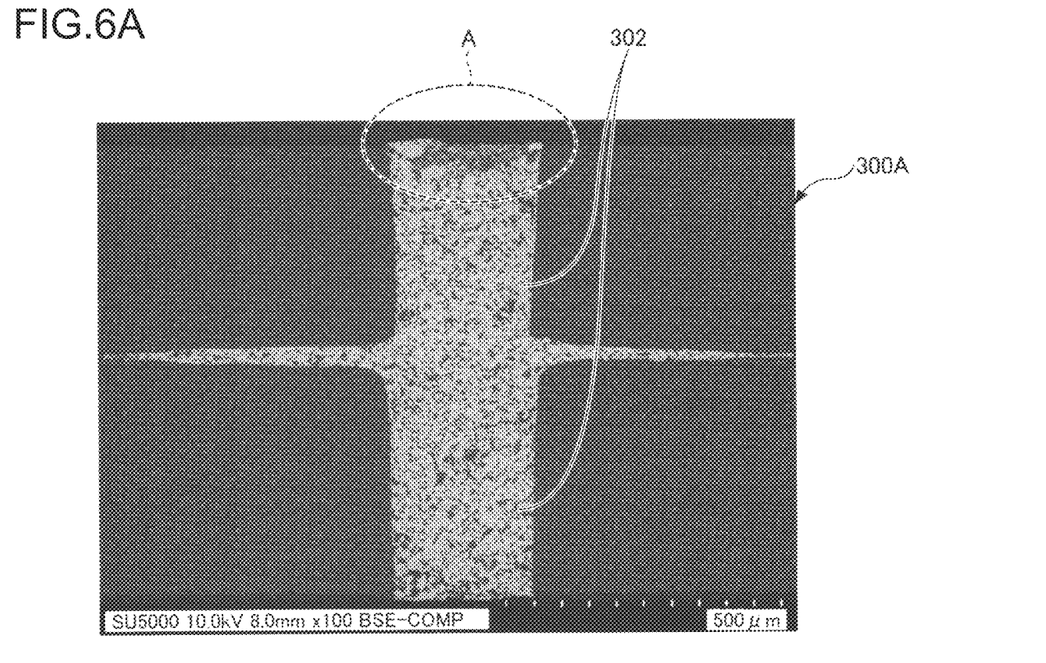
FIGS. 6A and 6B are views showing SEM images of Comparative Example 1 and Example 1.
Figure 6B:
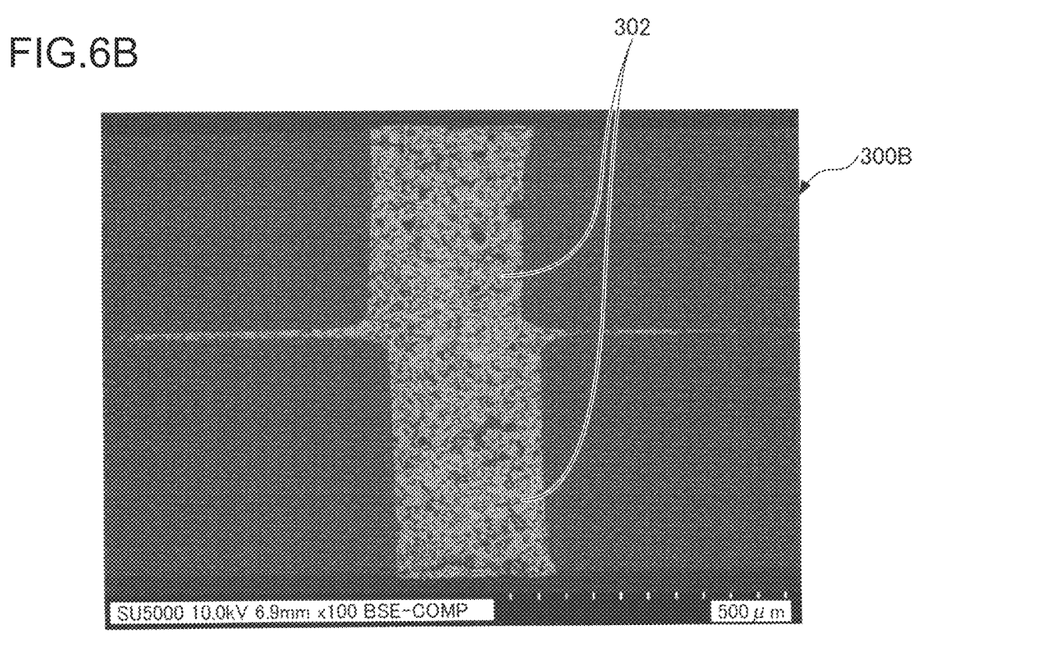

FIG. 6A shows an SEM image of the sample 300A. FIG. 6B shows an SEM image of the sample 300B. In the sample 300A, an upper portion of an electric conductor in one of the vias 302 (inside a portion A encircled by a broken line) was chipped off. Therefore, it can be inferred that the molybdenum was insufficiently sintered so that low adhesion between the electric conductor in the via 302 and the ceramics caused the chipping during the polishing. On the other hand, in the sample 300B, an electric conductor in each of the vias 302 was not chipped off. Therefore, it can be inferred that the molybdenum was sufficiently sintered to enhance adhesion between the electric conductor in the via 302 and the ceramics.

Figure 7:
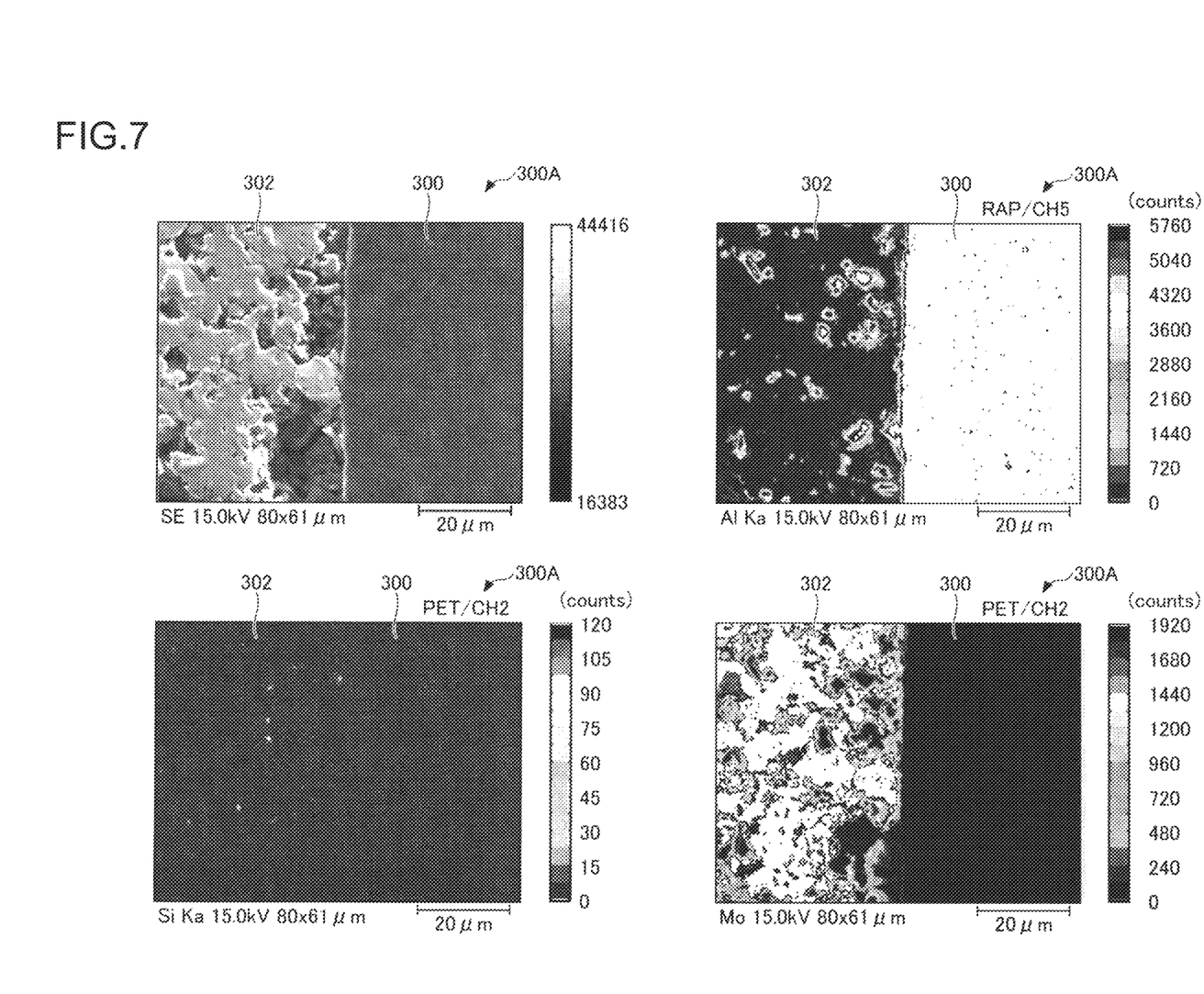
FIG. 7 is a view showing an EPMA analysis result of a section of Comparative Example 1.
Figure 8:
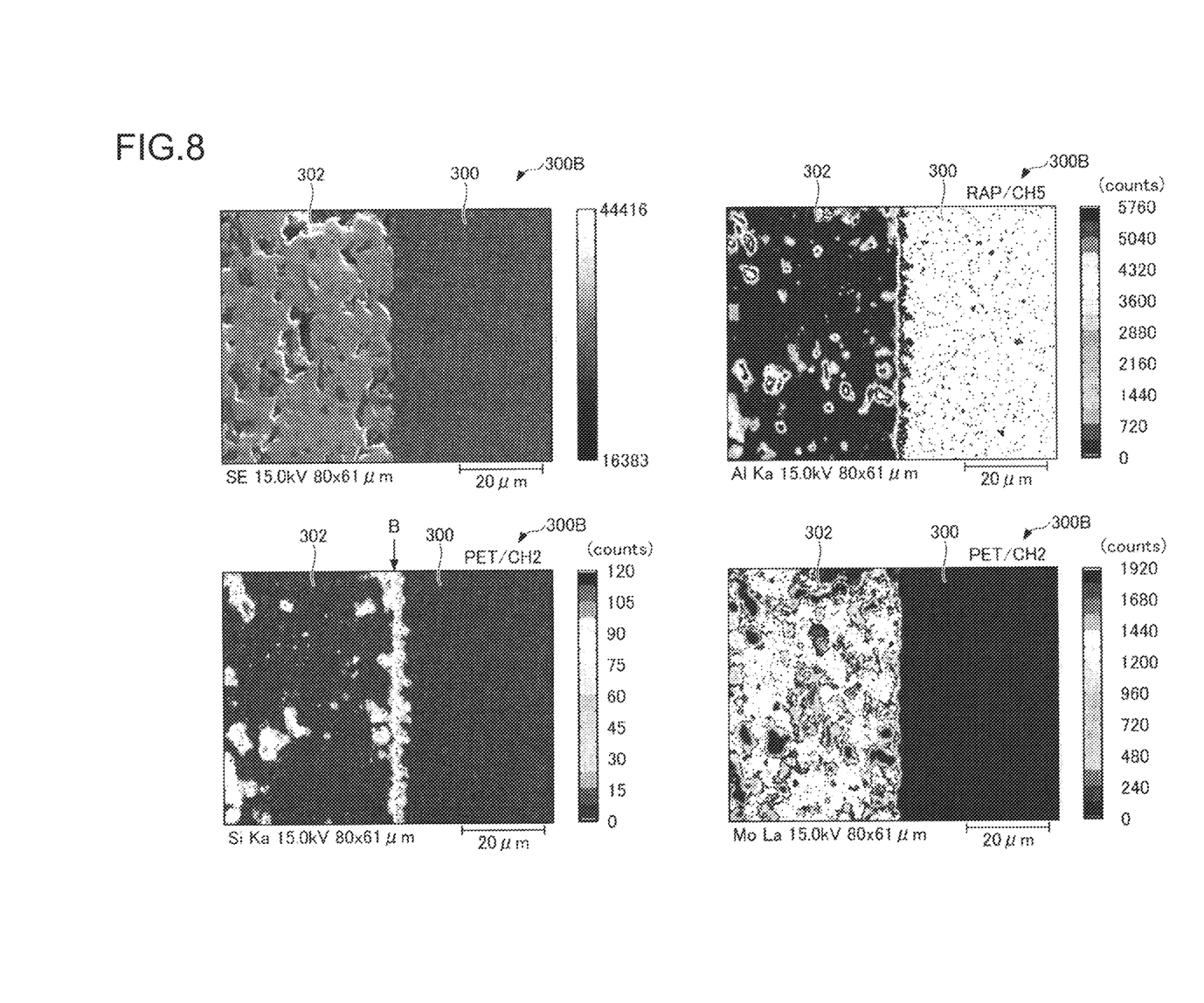
FIG. 8 is a view showing an EPMA analysis result of a section of Example 1.

FIG. 7 shows an EPMA analysis result of a section of the sample 300A. FIG. 8 shows an EPMA analysis result of a section of the sample 300B. From FIG. 7, in the sample 300A, the electrically conductive paste did not contain silica. It was therefore a matter of course that an Si component was absent. On the other hand, from FIG. 8, it was confirmed that, in the sample 300B, an Si component was present in both the electric conductors in the vias 302 and the ceramics (the fired green sheets 300), and particularly present only in the vicinity of a boundary (within a range of 20 μm or less on the ceramics side including the boundary B) in the ceramics.

Thus, the Si component was present only within the range of 20 μm or less on the ceramics side including the boundary B and did not diffuse beyond that range. Accordingly, the possibility of degrading characteristics of the ceramics can be reduced.

Example 2, Comparative Example 2

A green sheet in which a ceramics material was made of aluminum oxide and did not contain any sintering aid was prepared. Then, a pad was formed on each surface of this green sheet using an electrically conductive paste in which 0.5 wt % of nickel oxide powder, 2.0 wt % of alumina powder, and 2.0 wt % of silica powder were added with respect to an amount of molybdenum powder. Then, after the green sheet and the pad were fired simultaneously under atmospheric pressure, the pad was removed by polishing to expose the ceramics. As a result, a sample 300C according to Example 2 was produced.

In addition, a green sheet in which a ceramics material was made of aluminum oxide and contained a sintering aid was prepared. Then, a pad was formed on each surface of this green sheet using an electrically conductive paste in which 0.5 wt % of nickel oxide powder, 2.0 wt % of alumina powder, and 2.0 wt % of silica powder were added with respect to an amount of molybdenum powder. Then, after the green sheet and the pad were fired simultaneously under atmospheric pressure, the pad was removed by polishing to expose the ceramics. As a result, a sample 300D according to Comparative Example 2 was produced.

Figure 9A:
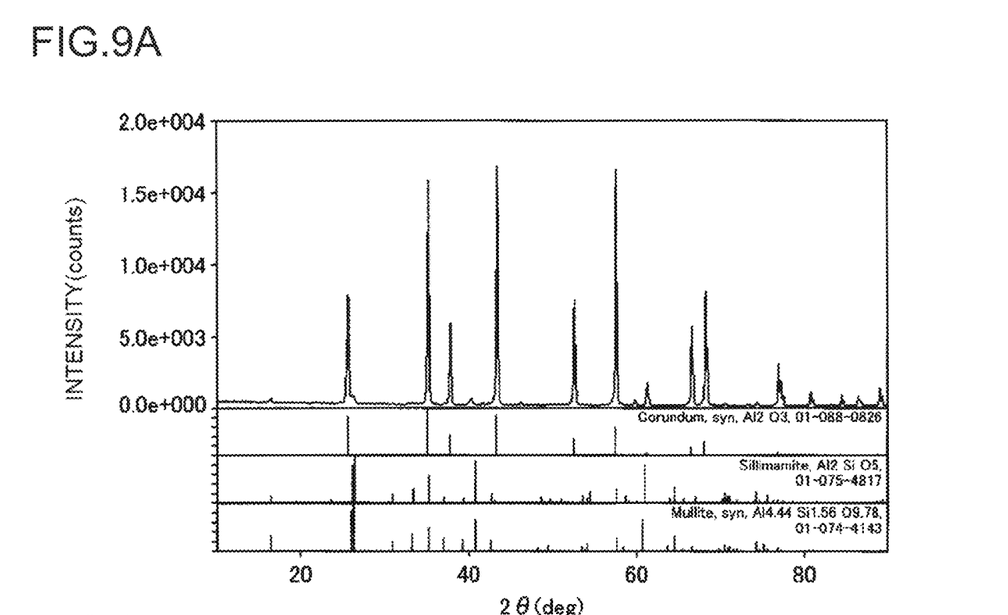
FIGS. 9A and 9B are views showing XRD analysis results of portions where ceramics were exposed according to Example 2 and Comparative Example 2.

FIG. 9A is an XRD analysis result of a portion where the ceramics were exposed by the polishing in the sample 300C. From FIG. 9A, it was confirmed that a crystal phase of mullite, sillimanite, or a mixture of the both was formed in, of the sample 300C according to Example 2, the portion where the ceramics were exposed.

An Si component of the silica that was added to the electrically conductive paste could be divided into an Si component that remained in an electric conductor after the firing and an Si component that diffused to the ceramics side. Since the Si component that diffused from the electric conductor to the ceramics side was consumed for forming a composite oxide layer of Al and Si near a boundary between the electric conductor and the ceramics, the Si component did not diffuse to the inside of the ceramics. It is considered that the composite oxide layer of Al and Si formed near the boundary between the electric conductor and the ceramics greatly contributed to improvement of adhesion between the electric conductor and the ceramics.

Moreover, a chemical formula of the mullite is $3Al_2O_3 \cdot 2SiO_2$ ($Al_6Si_2O_{13}$). A chemical formula of the sillimanite is $Al_2O_3$—$SiO_2$ ($Al_2SiO_5$). A range of the composite oxide layer of Al and Si can be controlled to some extent by the amounts of the alumina and the silica added to the electrically conductive paste.

Figure 9B:
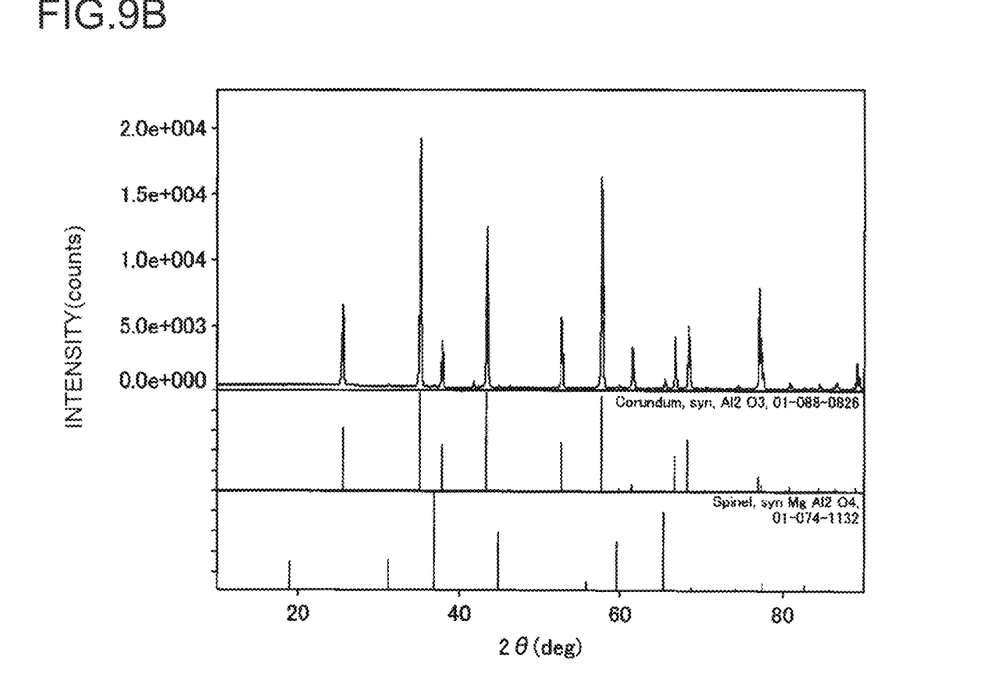

FIG. 9B shows an XRD analysis result of a portion where the ceramics are exposed by polishing in the sample 300D. From FIG. 9B, it was confirmed that crystal phases of mullite and sillimanite were not formed in the sample 300D according to Comparative Example 2.

Thus, in the electrostatic chuck 20 of the substrate fixing device 1, the substrate body 21 is made of ceramics containing aluminum oxide ($Al_2O_3$). Further, each of the vias 23a and 23b is a fired body containing molybdenum (Mo) as a main component and added with nickel oxide (NiO), aluminum oxide ($Al_2O_3$), and silicon dioxide ($SiO_2$).

By adding the nickel oxide to the electrically conductive paste that will serve as the vias 23a and 23b, sinterability of the molybdenum in the electric conductors forming the vias 23a and 23b is improved. Further, by adding the aluminum oxide and the silicon dioxide to the electrically conductive paste which will serve as the vias 23a and 23b, adhesion between the ceramics forming the substrate body 21 and the molybdenum is improved. Accordingly, it is unnecessary to use any sintering aid, so that the possibility of degrading the characteristics of the ceramics constituting the substrate body 21 is lowered.

Further, the molybdenum component and the nickel oxide component are not present in the ceramics forming the substrate body 21 but present only in the vias, and the aluminum oxide component and the silicon dioxide component are present in both the ceramics forming the substrate body 21 and the vias. Specifically, in the ceramics forming the substrate body 21, the silicon dioxide component is present only within the range of 20 μm from the boundary between the ceramics forming the substrate body 21 and the vias, and the composite oxide layer (the mullite layer, the sillimanite layer, or the layer in which the mullite layer and the sillimanite layer are mixed) of aluminum and silicon dioxide is formed within the aforementioned range. For this reason, the Si component does not diffuse beyond the composite oxide layer. Therefore, the possibility of degrading the characteristics of the ceramics forming the substrate body 21 is lowered. The range of the composite oxide layer can be changed by the amounts of the alumina and the silica added to the electrically conductive paste.

Further, the electrostatic electrode 22 is preferably a fired body containing tungsten (W) as a main component and added with nickel oxide (NiO), aluminum oxide ($Al_2O_3$), and silicon dioxide ($SiO_2$).

By adding the nickel oxide to the electrically conductive paste which will serve as the electrostatic electrode 22, the sinterability of the tungsten in the electric conductor forming the electrostatic electrode 22 is improved. Further, by adding the aluminum oxide and the silicon dioxide to the electrically conductive paste which will serve as the electrostatic electrode 22, the adhesion between the ceramics forming the substrate body 21 and the tungsten is improved. Accordingly, it is unnecessary to use any sintering aid, so that the possibility of degrading the characteristics of the ceramics forming the substrate body 21 is lowered.

Purity of the aluminum oxide in the ceramics forming the substrate body 21 is preferably 99.5% or more. As a result, in the substrate body 21, temperature dependence of insulation resistance is so small that the decrease of the insulation resistance with respect to a temperature rise can be suppressed.

The ceramics forming the substrate body 21 preferably have a relative density of 97% or more with respect to the aluminum oxide. Such a substrate body 21 has a small number of pores in the surface and inside thereof. The pores affect adsorption of the substrate body 21. Accordingly, the substrate body 21 high in relative density is preferable in terms of characteristics as the substrate fixing device 1.

Second Embodiment

Figure 10:
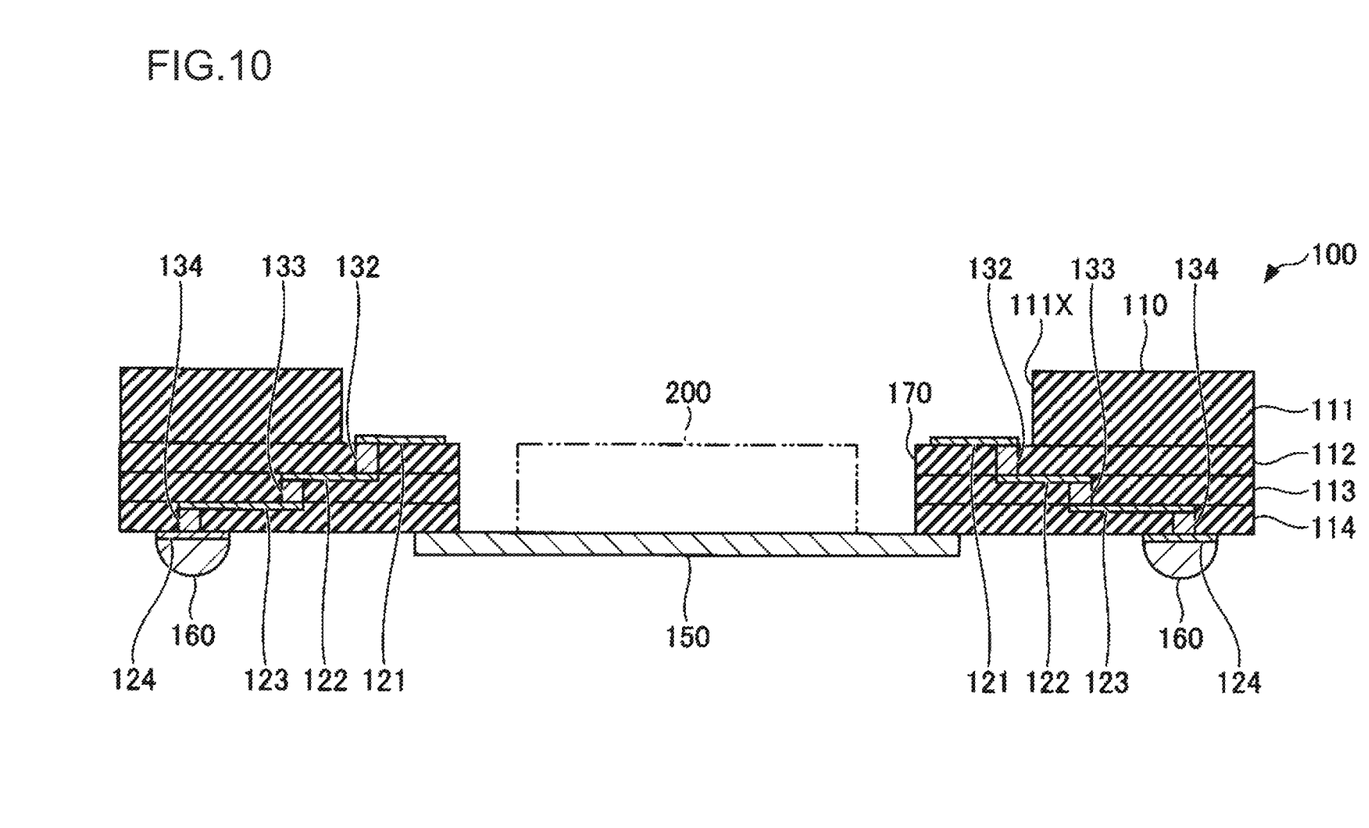
FIG. 10 is a sectional view illustrating a semiconductor device package according to a second embodiment.
Figure 11:
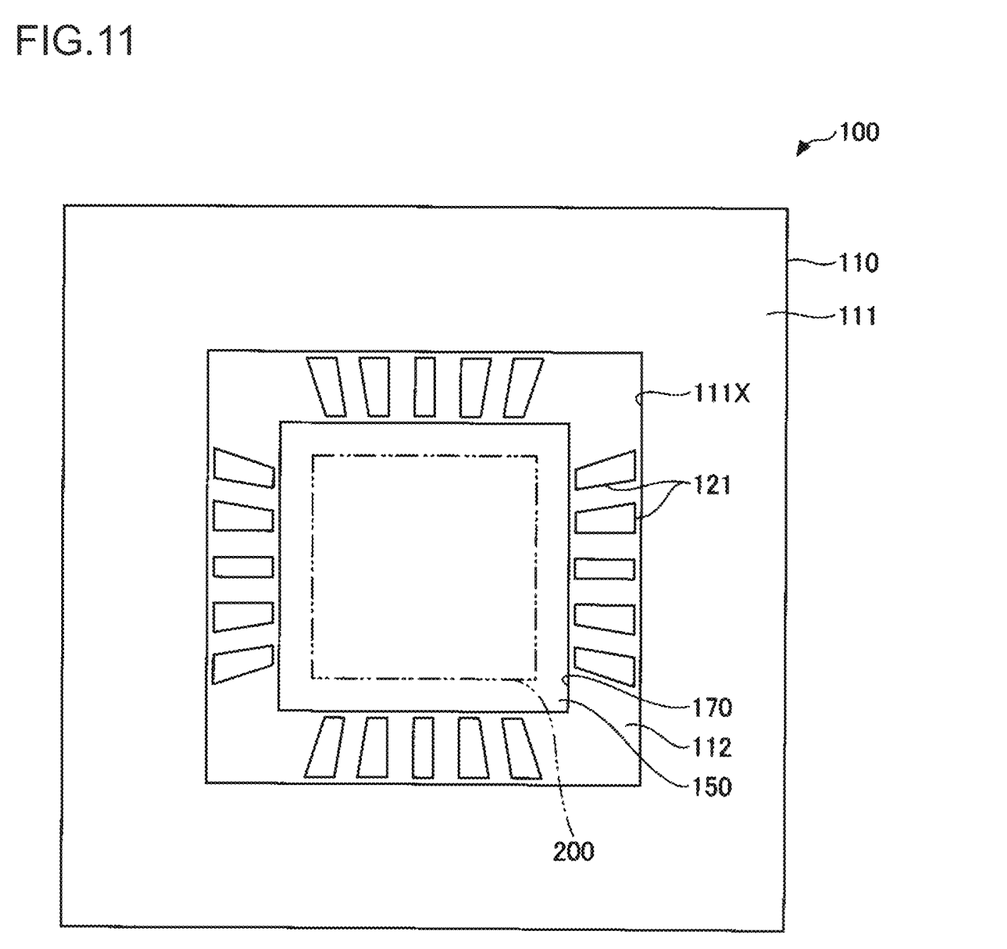
FIG. 11 is a plan view illustrating the semiconductor device package according to the second embodiment.

In a second embodiment, an example of a semiconductor device package having a ceramics substrate described in the first embodiment is shown. FIG. 10 is a sectional view illustrating the semiconductor device package according to the second embodiment. FIG. 11 is a plan view illustrating the semiconductor device package according to the second embodiment.

As shown in FIG. 10, the semiconductor device package 100 has a ceramics substrate 110, a heat radiating plate 150, and external connection terminals 160, and the heat radiating plate 150 is brazed to the ceramics substrate 110.

The ceramics substrate 110 includes a plurality of (four in the present embodiment) ceramics substrate materials 111, 112, 113, and 114 laminated on one another, wiring patterns 121, 122, 123, and 124, and vias 132, 133, and 134 that penetrate the ceramics substrate materials 112, 113, and 114. The vias 132 connect the wiring patterns 121 and 122 to each other, the vias 133 connect the wiring patterns 122 and 123 to each other, and the vias 134 connect the wiring patterns 123 and 124 to each other. In the ceramics substrate 110, the ceramics substrate materials 111 to 114 configure a substrate body.

As shown in FIG. 10 and FIG. 11, a cavity 170 that penetrates central portions of the ceramics substrate materials 112, 113 and 114 is provided in the ceramics substrate 110 so that a semiconductor element 200 can be mounted in the cavity 170. The wiring patterns 121 are disposed on an upper face of the ceramics substrate material 112 so as to surround the cavity 170. An opening portion 111X that exposes the wiring patterns 121 is formed in the ceramics substrate material 111.

The ceramics substrate materials 111 to 114 are made of ceramics containing aluminum oxide, and each of the wiring patterns 121 to 124 is made of a fired body of an electric conductor paste, which contains tungsten as a main component and further contains nickel oxide, aluminum oxide, and silicon dioxide. Further, each of the vias 132 to 134 is a fired body of an electric conductor paste, which contains molybdenum as a main component and further contains nickel oxide, aluminum oxide, and silicon dioxide. The ceramics substrate 110 can be manufactured by the same manufacturing method as that of the electrostatic chuck 20 according to the first embodiment.

In the semiconductor device package 100, the semiconductor element 200 is mounted on the heat radiating plate 150. A pad of the semiconductor element 200 is electrically connected to the wiring patterns 121 of the ceramics substrate 110 by bonding wires or the like. As a result, the semiconductor element 200 is connected to the external connection terminals 160 through the wiring patterns 121 to 124 and the vias 132 to 134.

In such a semiconductor device package 100, the ceramics substrate 110 including the wiring patterns 121 to 124 and the vias 132 to 134 can be obtained in the same manner as in the first embodiment without degrading characteristics of the ceramics substrate materials 111 to 114 that serve as the substrate body. In the ceramics substrate 110, adhesion between the ceramics substrate materials 111 to 114 and the wiring patterns 121 to 124, adhesion between the ceramics substrates 111 to 114 and the vias 132 to 134, and adhesion between the wiring patterns 121 to 124 and the vias 132 to 134 can be improved.

Although the preferred embodiments and the like have been described in detail above, the present disclosure is not limited to the aforementioned embodiments and the like, and various modifications and substitutions can be made on the aforementioned embodiments and the like without departing from the scope described in Claims.

For example, in the first embodiment, the members included in the substrate fixing device or the layout of the members may be appropriately changed.

Further, in the first embodiment, the heating element 24 may be disposed between the electrostatic chuck 20 and the base plate 10. Further, the heating element 24 may be provided internally in the base plate 10. Moreover, the heating element 24 may be externally attached to the electrostatic chuck.

In addition, the substrate fixing device according to the first embodiment is used in a semiconductor manufacturing apparatus. The semiconductor manufacturing apparatus is, for example, a dry etching apparatus (such as a parallel flat plate type reactive ion etching (RIE) apparatus).

Further, besides a semiconductor wafer (such as a silicon wafer), a glass substrate used in a process of manufacturing a liquid crystal panel or the like may be used as the object to be adsorbed by the substrate fixing device according to the first embodiment.

Various aspects of the subject matter described herein are set out non-exhaustively in the following numbered clause:

1) A method of manufacturing a ceramics substrate, wherein the ceramics substrate comprises a substrate body, an electric conductor layer built in the substrate body, and a via built in the substrate body to be electrically connected to the electric conductor layer, the method comprising:

forming a first electrically conductive paste with a predetermined pattern on a green sheet, wherein the green sheet is made of a mixture of sintering aid-free aluminum oxide and an organic material;

filling a through hole formed in the green sheet with a second electrically conductive paste, wherein the second electrically conductive paste contains molybdenum as a main component and further contains nickel oxide, aluminum oxide and silicon dioxide; and firing the green sheet, the first electrically conductive paste, and the second electrically conductive paste to form the substrate body, the electric conductor layer, and the via.

What is claimed is:

1. A ceramics substrate comprising:
a substrate body;
an electric conductor layer that is built in the substrate body; and
a via that is built in the substrate body to be electrically connected to the electric conductor layer,
wherein:
the substrate body is made of ceramics containing aluminum oxide; and
the via is made of a fired body of an electric conductor paste, wherein the electric conductor paste contains molybdenum as a main component and further contains nickel oxide, aluminum oxide, and silicon dioxide.

2. The ceramics substrate according to claim 1, wherein in the electric conductor paste, a content of the nickel oxide is 0.2 wt % to 1.0 wt % with respect to the molybdenum.

3. The ceramics substrate according to claim 1, wherein in the electric conductor paste,
a content of the aluminum oxide is 2.0 wt % to 20.0 wt % with respect to the molybdenum, and
a content of the silicon dioxide is 0.2 wt % to 3.0 wt % with respect to the molybdenum.

4. The ceramics substrate according to claim 1, wherein in the electric conductor paste,
an average particle size of the molybdenum is 0.5 μm to 3.0 μm,
an average particle size of the nickel oxide is 5.0 μm to 15.0 μm,
an average particle size of the aluminum oxide is 0.1 μm to 4.0 μm, and
an average particle size of the silicon dioxide is 0.1 μm to 12.0 μm.

5. The ceramics substrate according to claim 1, wherein the substrate body contains silicon but does not contain molybdenum and nickel.

6. The ceramics substrate according to claim 5, wherein the silicon contained in the substrate body is present only within a range of 20 μm from a boundary between the substrate body and the via.

7. The ceramics substrate according to claim 6, wherein a composite oxide layer containing oxygen, aluminum and silicon is formed within the range of 20 μm from the boundary between the substrate body and the via.

8. The ceramics substrate according to claim 7, wherein the composite oxide layer contains at least one of a mullite layer and a sillimanite layer.

9. The ceramics substrate according to claim 1, wherein purity of the aluminum oxide in the substrate body is 99.5% or more.

10. The ceramics substrate according to claim 1, wherein a relative density of the substrate body to the aluminum oxide is 97% or more.

11. The ceramics substrate according to claim 1, wherein an average particle size of the aluminum oxide in the substrate body is 1.0 μm to 3.0 μm.

12. The ceramics substrate according to claim 1, wherein the electric conductor layer is made of a fired body of an electric conductor paste, wherein the electric conductor paste contains tungsten as a main component and further contains nickel oxide, aluminum oxide and silicon dioxide.

13. The ceramics substrate according to claim 1, wherein the ceramics substrate is an electrostatic chuck that is configured to adsorb an object, and
the electric conductor layer is an electrostatic electrode.

14. A semiconductor device package comprising the ceramics substrate according to claim 1.

15. A substrate fixing device comprising:
a base plate; and
the ceramics substrate according to claim 13 that is mounted on one face of the base plate.

* * * * *